United States Patent
Bourstein

(10) Patent No.: US 11,705,427 B2
(45) Date of Patent: Jul. 18, 2023

(54) MIRROR-IMAGE CHIPS ON A COMMON SUBSTRATE

(71) Applicant: MELLANOX TECHNOLOGIES, LTD., Yokneam (IL)

(72) Inventor: Ido Bourstein, Pardes Hana-Karkur (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 106 days.

(21) Appl. No.: 17/493,882

(22) Filed: Oct. 5, 2021

(65) Prior Publication Data

US 2023/0105149 A1    Apr. 6, 2023

(51) Int. Cl.
| | |
|---|---|
| *H01L 25/065* | (2023.01) |
| *H01L 25/00* | (2006.01) |
| *H01L 21/60* | (2006.01) |
| *H01L 23/538* | (2006.01) |

(52) U.S. Cl.
CPC .......... *H01L 25/0652* (2013.01); *H01L 21/60* (2021.08); *H01L 23/5385* (2013.01); *H01L 23/5386* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 7,315,454 B2* | 1/2008 | Schuster | G11C 5/00 361/736 |
| 2010/0289131 A1* | 11/2010 | Bathan | H01L 24/81 257/E23.06 |
| 2011/0248396 A1* | 10/2011 | Liu | H01L 25/0657 438/459 |
| 2016/0037643 A1* | 2/2016 | Kim | H01L 25/0655 361/767 |
| 2016/0172332 A1* | 6/2016 | Haba | H01L 24/09 257/774 |
| 2021/0151408 A1* | 5/2021 | Yu | H01L 24/08 |

FOREIGN PATENT DOCUMENTS

CN    210489612 U    *    5/2020

* cited by examiner

*Primary Examiner* — Michael Lebentritt
(74) *Attorney, Agent, or Firm* — Kligler & Associates Patent Attorneys Ltd

(57) ABSTRACT

An electronic device includes a substrate having contact pads disposed thereon and traces interconnecting the contact pads. A first integrated circuit (IC) die is mounted on the substrate and includes a predefined set of circuit components arranged on the first IC die in a first geometrical pattern, which is non-symmetrical under reflection about a given axis in a plane of the die. A second IC die is mounted on the substrate and includes the predefined set of circuit components arranged on the second IC die in a second geometrical pattern, which is a mirror image of the first geometrical pattern with respect to the given axis.

22 Claims, 3 Drawing Sheets

MIRROR-IMAGE CHIPS ON A COMMON SUBSTRATE

FIELD OF THE INVENTION

The present invention relates generally to integrated circuit (IC) chips, and particularly to multi-chip modules and methods for their manufacture.

BACKGROUND

A multi-chip module is an electronic assembly in which multiple IC dies are mounted and interconnected on a common substrate, which is then packaged as if it were a single, larger IC. The substrate may itself comprise a semiconductor chip with suitable internal and external mounting pads, along with interconnecting traces; or it may alternatively comprise a ceramic or laminated printed circuit board.

SUMMARY

Embodiments of the present invention that are described hereinbelow provide improved multi-die IC devices and methods for the design and fabrication of such devices.

There is therefore provided, in accordance with an embodiment of the invention, an electronic device, including a substrate having contact pads disposed thereon and traces interconnecting the contact pads. A first integrated circuit (IC) die is mounted on the substrate and includes a predefined set of circuit components arranged on the first IC die in a first geometrical pattern, which is non-symmetrical under reflection about a given axis in a plane of the die. A second IC die is mounted on the substrate and includes the predefined set of circuit components arranged on the second IC die in a second geometrical pattern, which is a mirror image of the first geometrical pattern with respect to the given axis.

In some embodiments, the second IC die is mounted on the substrate in a location adjacent to the first IC die. In a disclosed embodiment, the first and second IC dies are mounted on the substrate such that respective first edges of the first and second IC dies are in mutual proximity, and the predefined set of circuit components includes an interface circuit, which is disposed in proximity to respective second edges of the first and second IC dies, opposite the respective first edges.

Additionally or alternatively, the device includes a third IC die including a switching core mounted on the substrate, wherein the first and second IC dies include switch ports and are mounted on the substrate in respective locations adjacent to the third IC die.

Further additionally or alternatively, in some embodiments in which the predefined set of circuit components includes an interface circuit, which is disposed in proximity to respective edges of the first and second IC dies, and the contact pads include at least first and second contact pads, the traces include a first trace connecting the first contact pad to the interface circuit of the first IC die and a second trace connecting the second contact pad to the interface circuit of the second IC die, wherein the second trace is routed alongside the first trace on the substrate. In a disclosed embodiment, the first and second contact pads are mutually adjacent. Additionally or alternatively, the device includes a third IC die, and the first and second IC dies are mounted on the substrate adjacent to different, respective edges of the third IC die.

There is also provided, in accordance with an embodiment of the invention, a method for fabricating an electronic device. The method includes providing a substrate having contact pads disposed thereon and traces interconnecting the contact pads. First and second integrated circuit (IC) dies are mounted on the substrate. The first IC die includes a predefined set of circuit components arranged on the first IC die in a first geometrical pattern, which is non-symmetrical under reflection about a given axis in a plane of the die. The second IC die includes the predefined set of circuit components arranged on the second IC die in a second geometrical pattern, which is a mirror image of the first geometrical pattern with respect to the given axis.

In some embodiments, the method includes fabricating first and second pluralities of the first and second IC dies on a single semiconductor wafer, and dicing the semiconductor wafer to provide the first and second IC dies for mounting on the substrate. In a disclosed embodiment, fabricating the first and second pluralities of the first and second IC dies includes applying a photolithographic process to the semiconductor wafer using a reticle containing both the first and second geometrical patterns.

The present invention will be more fully understood from the following detailed description of the embodiments thereof, taken together with the drawings in which:

DETAILED DESCRIPTION OF EMBODIMENTS

Figure 1:
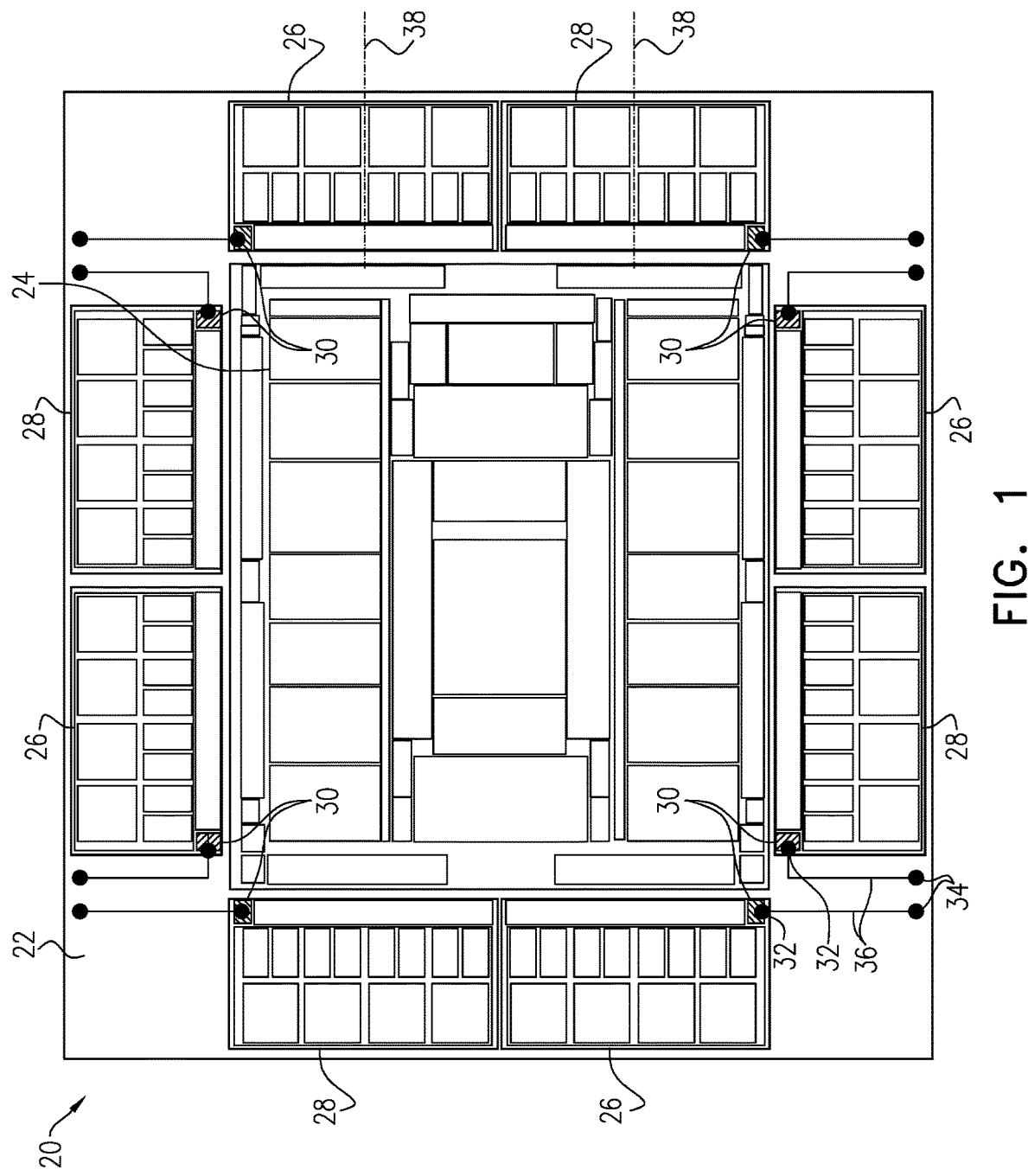
FIG. 1 is a schematic frontal view of a multi-chip IC assembly, in accordance with an embodiment of the invention.

Some multi-chip modules contain multiple IC dies with similar or identical functionalities. For example, a large-scale high-speed packet switch may contain one IC die comprising a switching core and multiple IC dies comprising switch ports, which are connected to the switching core through traces on the substrate. Although dividing the functions of the switch among multiple chips increases the complexity of assembling the multi-chip module, it is often economically advantageous because of the greater yield that can be achieved in producing smaller dies. In some applications, the division into several dies is unavoidable as the silicon die size is limited by the manufacturing reticle size, which is not large enough to accommodate all the required functionality and/or features.

Another consideration in designing the multi-chip module is the length and complexity of the traces on the module substrate that will be needed to connect the IC dies to one another and to the contact pads that connect the module to external interfaces. In this regard, it is desirable that the circuit components within each die be laid out in a way that simplifies the layout of the traces on the substrate and avoids the need for long traces traversing through multiple metal layers. For this reason, for example, interface and other input/output (I/O) circuits within the IC dies are advantageously placed at the edges of the dies in locations that can be accessed easily by traces on the module substrate.

When multiple IC dies with the same set of circuit components and functionalities are used in the same multi-chip module, the dies typically all have the same geometrical layout. Using identical dies is convenient, since many dies can then be fabricated together on the same semiconductor wafer, using the same photolithographic mask. When these identical IC dies are laid out in the multi-chip module, however, some of the interface circuits may be in inconvenient locations. For example, when two identical dies having an interface circuit in the lower-right corner are mounted side-by-side, the interface circuit of the right-hand die will be at the outer edge of the layout and thus can be reached easily by traces on the substrate; but the interface circuit of the left-hand die will be surrounded by other circuit components and may be harder to reach. (The terms "left," "right," "upper" and "lower" are used here arbitrarily for the sake of conceptual clarity and do not necessarily have any functional meaning.) It would be possible to redesign the left-hand die to avoid this problem, but such a redesign will incur high costs in terms of re-engineering, testing, and mask production.

Embodiments of the present invention that are described herein address these problems by providing pairs of mirror-image dies, which are then mounted on the same substrate. In other words, after a first die is designed and verified, with a set of circuit components arranged in a certain geometrical pattern, the second die is created with the same set of circuit components in a geometrical pattern that is a mirror image of the first die. (The mirror image is with respect to a certain axis in the plane of the dies about which the geometrical pattern is non-symmetrical.) As all the layers in the second die, as well as the reticles that are used to fabricate them, are simply mirror images of those in the first die, there is no need for substantial redesign and testing prior to producing the second die, and consequently little added cost.

Thus, in the disclosed embodiments, the second die is functionally identical to the first die, but with a mirror-image geometrical layout of circuit components and contact pads. The first and second dies can then be mixed as desired on the substrate of the multi-chip module so as to simplify and optimize the layouts of the pads and traces on the substrate. Referring back to the previous example, the IC dies can be mounted, for instance, so that the interface circuits of both the "left-hand" and "right-hand" dies are disposed in proximity to the outer edges of the dies.

FIG. 1 is a schematic frontal view of a multi-chip IC assembly 20, in accordance with an embodiment of the invention. Assembly 20 comprises a substrate 22, for example a silicon chip or a ceramic or laminated circuit board. Contact pads 32, 34 and traces 36 interconnecting the contact pads are formed on substrate 22, typically by methods of film deposition and photolithographic etching and/or other techniques that are known in the art. Contact pads 32 serve as internal mounting pads for IC dies 24, 26, 28 and other components on substrate 22, while contact pads 34 are used for connecting assembly externally to a printed circuit board or other receptacle. Although pads 34 are shown, for the sake of simplicity, on the upper surface of substrate 22, in practice pads 34 are commonly located on the lower surface of the substrate, with vias (not shown) connecting pads 34 to traces 36.

In the example shown in FIG. 1, assembly 20 serves as a switch in a packet network. For this purpose, die 24 comprises a switching core, which is mounted centrally on substrate 22, while dies 26 and 28 comprise switch ports and are mounted on the substrate in respective locations adjacent to die 24. Die 26 comprises a set of circuit components, which are arranged on the die in a certain geometrical pattern, which is non-symmetrical under reflection about an axis 38 in the plane of the die. Die 28 comprises the same set of circuit components as die 26, but the components are arranged in a geometrical pattern that is a mirror image of the pattern of die 26 with respect to axis 38. Specifically, dies 26 and 28 each comprise an interface circuit 30, such as a general-purpose input/output (GPIO) interface, but the location of circuit 30 in die 28 is opposite that in die 26.

In the pictured embodiment, a pair of dies 26 and 28 is mounted adjacent to each side of die 24. Dies 26 and 28 in each pair are mounted to that the inner edges of the dies are in mutual proximity, while interface circuit 30 in each die 26, 28 is located at the outer edge of the die (which may be either the left or the right edge, depending on the disposition of the die). Pads 32 on substrate 22 connect interface circuits 30 via traces 36 to pads 34 for external connection. Because the interface circuits are conveniently located at the outer edges of dies 26, 28, traces 36 are short and simple to route. (By contrast, if only dies 26 were used in assembly 20, the traces connecting to the interface circuits of at least some of the dies would have to be routed underneath the dies to reach the locations of pads 34.) Specifically, in the present example, the trace 36 that connects to interface circuit 30 of each die 26 is routed alongside the trace 36 that connects to the interface circuit of the neighboring die 28 that is mounted around the corner of die 24. The contact pads 34 on substrate 22 to which these pairs of traces are connected are likewise mutually adjacent.

Although the example shown in FIG. 1 relates specifically to a network switch, the principles of this embodiment may similarly be applied in other multi-chip assemblies, and particularly in assemblies in which a central die is surrounded by multiple peripheral dies.

Figure 2:
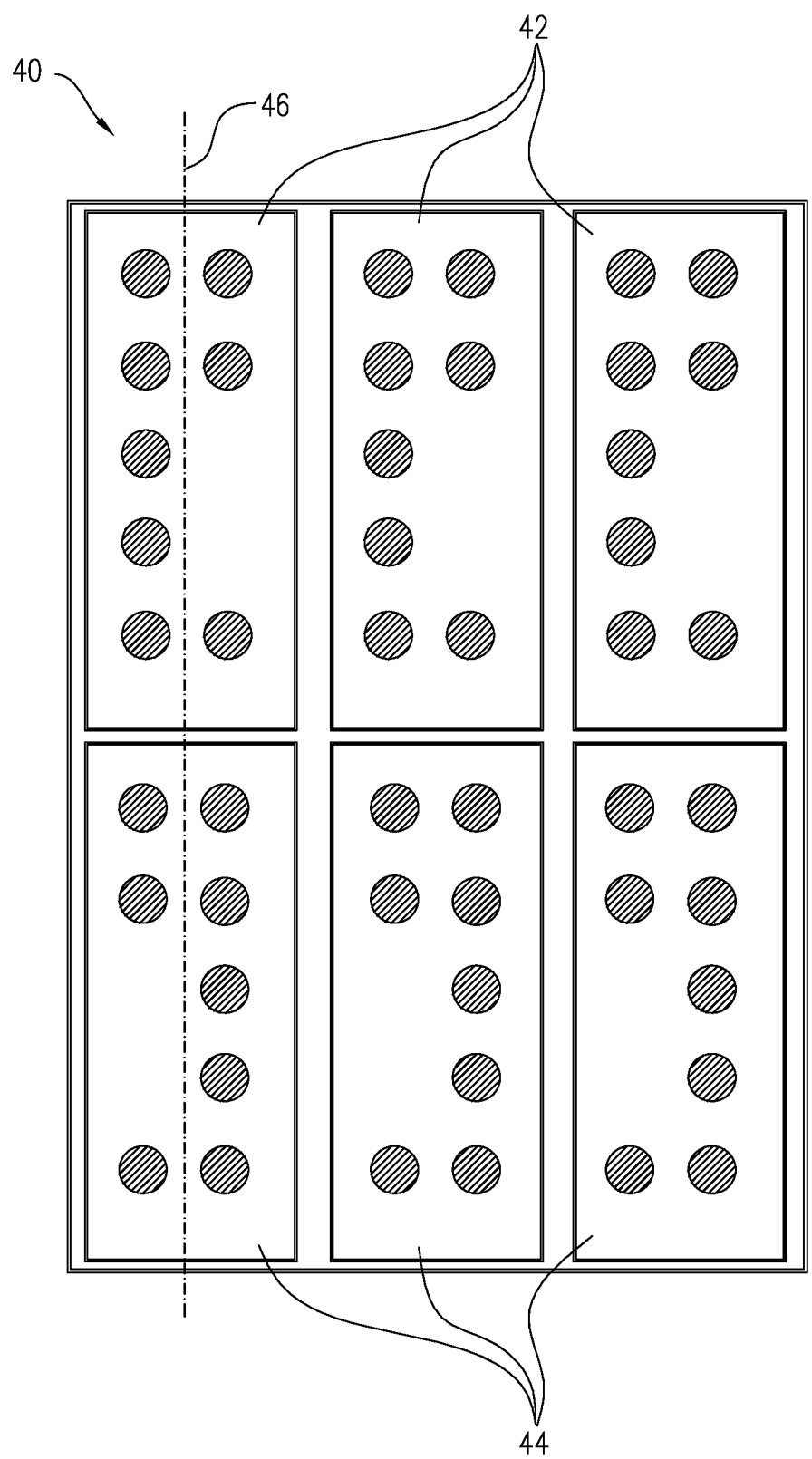
FIG. 2 is a schematic frontal view of a photolithographic mask reticle, in accordance with an embodiment of the invention.
Figure 3:
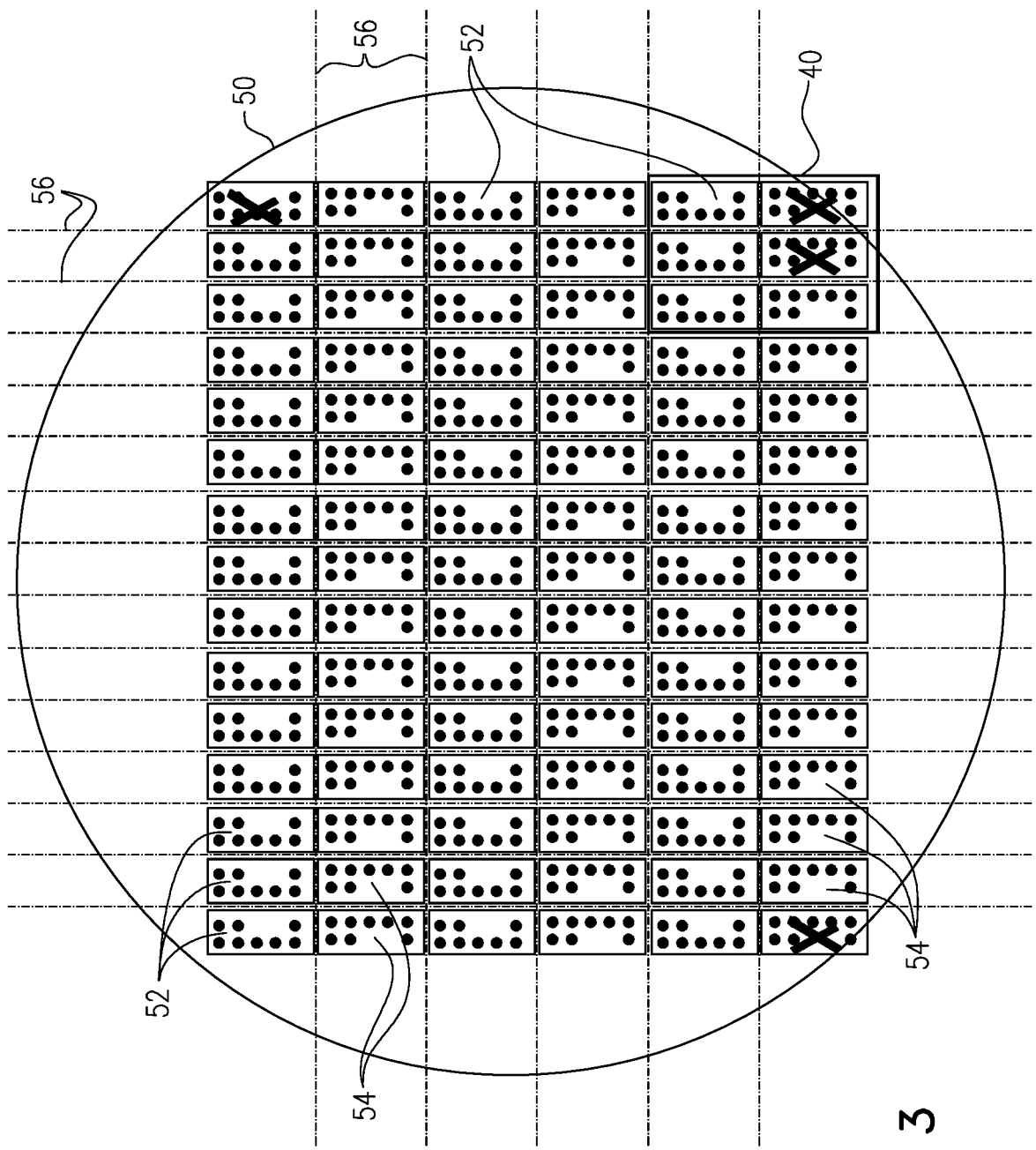
FIG. 3 is a schematic frontal view of a semiconductor wafer on which multiple IC dies have been fabricated, in accordance with an embodiment of the invention.

Reference is now made to FIGS. 2 and 3, which schematically illustrate a method for fabricating mirror-image dies (such as dies 26 and 28, as shown above), in accordance with an embodiment of the invention. The patterns of the dies are simplified for clarity of illustration. FIG. 2 is a schematic frontal view of a photolithographic reticle 40, which is used in producing the mirror-image dies, while FIG. 3 is a schematic frontal view of a semiconductor wafer 50 on which multiple mirror-image dies 52 and 54 have been fabricated.

Reticle 40 in this example is designed for simultaneous photolithographic exposure of multiple dies, including a first die pattern 42 and a second die pattern 44. Patterns 42 and 44 are mirror-images of one another, reflected above an axis 46. The elements of patterns 42 and 44 would ordinarily correspond to parts of circuit components. After design and verification of the elements of pattern 42, for example, using electronic design automation (EDA) tools that are known in the art, these elements are flipped about axis 46 by a simple geometrical operation of the EDA tools to create pattern 44. Flipping the patterns in this manner typically has no effect on their functionality. Therefore, little or no added testing is required to verify pattern 44.

To fabricate dies 52 and 54 on wafer 50, reticle 40 is stepped across the wafer, and photoresist on the wafer surface is exposed through the reticle at each step. Thus, alternating rows of mirror-image dies 52 and 54 are exposed and etched across the wafer surface. Following these fabrication steps, wafer 50 is diced along scribe lines 56 to provide multiple dies 52 and multiple dies 54. After testing, the dies are mounted on a substrate, for example in the manner in which dies 26 and 28 are mounted on substrate 22 (FIG. 1). Since dies 52 and 54 are of the same size, wafer 50 can be diced as though it contained only one type of die (only die 52 or only die 54), with no loss of yield.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An electronic device, comprising:
   a substrate having contact pads disposed thereon and traces interconnecting the contact pads;
   a first integrated circuit (IC) die, which is mounted on the substrate and comprises a predefined set of circuit components arranged on the first IC die in a first geometrical pattern, which is non-symmetrical under reflection about a given axis in a plane of the die; and
   a second IC die, which is mounted on the substrate and comprises the predefined set of circuit components arranged on the second IC die in a second geometrical pattern, which is a mirror image of the first geometrical pattern with respect to the given axis.

2. The device according to claim 1, wherein the second IC die is mounted on the substrate in a location adjacent to the first IC die.

3. The device according to claim 2, wherein the first and second IC dies are mounted on the substrate such that respective first edges of the first and second IC dies are in mutual proximity, and wherein the predefined set of circuit components comprises an interface circuit, which is disposed in proximity to respective second edges of the first and second IC dies, opposite the respective first edges.

4. The device according to claim 2, and comprising a third IC die comprising a switching core mounted on the substrate, wherein the first and second IC dies comprise switch ports and are mounted on the substrate in respective locations adjacent to the third IC die.

5. The device according to claim 2, wherein the predefined set of circuit components comprises an interface circuit, which is disposed in proximity to respective edges of the first and second IC dies, and
   wherein the contact pads comprise at least first and second contact pads, and
   wherein the traces comprise a first trace connecting the first contact pad to the interface circuit of the first IC die and a second trace connecting the second contact pad to the interface circuit of the second IC die, wherein the second trace is routed alongside the first trace on the substrate.

6. The device according to claim 5, wherein the first and second contact pads are mutually adjacent.

7. The device according to claim 5, and comprising a third IC die, wherein the first and second IC dies are mounted on the substrate adjacent to different, respective edges of the third IC die.

8. A method for fabricating an electronic device, the method comprising:
   providing a substrate having contact pads disposed thereon and traces interconnecting the contact pads;
   mounting on the substrate a first integrated circuit (IC) die, which comprises a predefined set of circuit components arranged on the first IC die in a first geometrical pattern, which is non-symmetrical under reflection about a given axis in a plane of the die; and
   mounting on the substrate a second IC die, which comprises the predefined set of circuit components arranged on the second IC die in a second geometrical pattern, which is a mirror image of the first geometrical pattern with respect to the given axis.

9. The method according to claim 8, wherein the second IC die is mounted on the substrate in a location adjacent to the first IC die.

10. The method according to claim 9, wherein the first and second IC dies are mounted on the substrate such that respective first edges of the first and second IC dies are in mutual proximity, and wherein the predefined set of circuit components comprises an interface circuit, which is disposed in proximity to respective second edges of the first and second IC dies, opposite the respective first edges.

11. The method according to claim 9, and comprising mounting on the substrate a third IC die comprising a switching core, wherein the first and second IC dies comprise switch ports and are mounted on the substrate in respective locations adjacent to the third IC die.

12. The method according to claim 9, wherein the predefined set of circuit components comprises an interface circuit, which is disposed in proximity to respective edges of the first and second IC dies, and
   wherein the contact pads comprise at least first and second contact pads, and
   wherein the method comprises routing a first trace on the substrate between the first contact pad and the interface circuit of the first IC die, and routing a second trace alongside the first trace on the substrate between the second contact pad and the interface circuit of the second IC die.

13. The method according to claim 12, wherein the first and second contact pads are mutually adjacent.

14. The method according to claim 12, and comprising mounting on the substrate a third IC die, wherein the first and second IC dies are mounted on the substrate adjacent to different, respective edges of the third IC die.

15. The method according to claim 8, and comprising fabricating first and second pluralities of the first and second IC dies on a single semiconductor wafer, and dicing the semiconductor wafer to provide the first and second IC dies for mounting on the substrate.

16. The method according to claim 15, wherein fabricating the first and second pluralities of the first and second IC dies comprises applying a photolithographic process to the semiconductor wafer using a reticle containing both the first and second geometrical patterns.

17. An electronic device comprising:
   a package; and
   at least one pair of dies comprising a first die and a second die mounted on the package, wherein the first die is a mirror image of the second die.

18. The electronic device of claim 17, comprising multiple pairs of first and second dies.

19. The electronic device of claim 17, wherein the first die is arranged adjacent to the second die.

20. The electronic device of claim 17, wherein each die of the pair is positioned in proximity to an edge of the package.

21. The electronic device of claim 18, wherein each pair is positioned in proximity to a respective edge of the package.

22. The electronic device of claim 17, comprising a third die, wherein the third die comprises a switching core and the first die and second die comprise switching ports.

* * * * *